United States Patent
De Jongh et al.

(10) Patent No.: US 7,309,907 B2
(45) Date of Patent: Dec. 18, 2007

(54) SEMICONDUCTOR DEVICE CARD METHODS OF INITIALIZING CHECKING THE AUTHENTICITY AND THE IDENTITY THEREOF

(75) Inventors: Petra Elisabeth De Jongh, Eindhoven (NL); Edwin Roks, Eindhoven (NL); Robertus Adrianus Maria Wolters, Eindhoven (NL); Hermanus Leonardus Peek, Eindhoven (NL)

(73) Assignee: NXP B.V., Eindhoven (NL)

( * ) Notice: Subject to any disclaimer, the term of this patent is extended or adjusted under 35 U.S.C. 154(b) by 7 days.

(21) Appl. No.: 10/497,264

(22) PCT Filed: Nov. 28, 2002

(86) PCT No.: PCT/IB02/05191

§ 371 (c)(1),
(2), (4) Date: May 27, 2004

(87) PCT Pub. No.: WO03/046802

PCT Pub. Date: Jun. 5, 2003

(65) Prior Publication Data

US 2005/0021993 A1    Jan. 27, 2005

(30) Foreign Application Priority Data

Nov. 28, 2001  (EP) ................... 01204589

(51) Int. Cl.
*H01L 31/11* (2006.01)
*H01L 27/14* (2006.01)

(52) U.S. Cl. ............... 257/577; 257/414; 257/E21.705

(58) Field of Classification Search ............... 257/577, 257/576, 578, 414, 416
See application file for complete search history.

(56) References Cited

U.S. PATENT DOCUMENTS

| | | | |
|---|---|---|---|
| 5,426,373 A * | 6/1995 | Diamond et al. | 324/663 |
| 6,047,068 A | 4/2000 | Rhelimi et al. | |
| 6,774,643 B2 * | 8/2004 | Magill | 324/663 |
| 2001/0033012 A1 | 10/2001 | Kommerling et al. | |
| 2005/0051351 A1* | 3/2005 | De Jongh et al. | 174/52.1 |
| 2005/0116307 A1* | 6/2005 | De Jongh et al. | 257/414 |

FOREIGN PATENT DOCUMENTS

WO    WO 98 18102    4/1998

\* cited by examiner

*Primary Examiner*—Sue A. Purvis
*Assistant Examiner*—Fazli Erdem (57) ABSTRACT

The semiconductor device (11) of the invention comprises a circuit that is covered by a passivation structure. It is provided with a first security element (12) that comprises a local area of the passivation structure and which has a first impedance. Preferably, a plurality of security elements (12) is present, whose the impedances differ. The semiconductor device (11) further comprises measuring means (4) for measuring an actual value of the first impedance, and a memory (7) comprising a first memory element (7A) for storing the actual value as a first reference value in the first memory element (7A). The semiconductor device (11) of the invention can be initialized by a method wherein the actual value is stored as the first reference value. Its authenticity can be checked by comparison of the actual value again measured and the first reference value.

13 Claims, 5 Drawing Sheets

SEMICONDUCTOR DEVICE CARD METHODS OF INITIALIZING CHECKING THE AUTHENTICITY AND THE IDENTITY THEREOF

The invention relates to a semiconductor device provided with a circuit comprising an active element, which circuit is present at a side of a substrate and is covered by a passivation structure, which semiconductor device is further provided with a first security element comprising a local area of the passivation structure and a first and a second electrode and having a first impedance.

The invention also relates to a card provided with a semiconductor device. The invention further relates to a method of initializing a semiconductor device and to a method of checking the authenticity of a semiconductor device and to a method of identifying a semiconductor device.

Such a semiconductor device and such a card are known from EP-A 300864. The first security element of the known device is a capacitor with two capacitor electrodes that are coupled capacitively together by the passivation structure. The device preferably comprises a plurality of security elements. On checking the authenticity of the device, a measured voltage is compared with a calculated reference voltage. If there is a difference, the authenticity is not recognized.

It is a disadvantage of the known device that the security elements can be circumvented. The security elements may be replaced by other structures with the same capacity which do not interfere with the underlying circuit free. Furthermore, the removal of the passivation structure and the electrodes in order to take a look at the circuit cannot be detected if the electrodes and the passivation structure are reapplied afterwards.

It is therefore a first object of the invention to provide a semiconductor device of the kind described in the opening paragraph, in which a removal of the passivation structure can be detected afterwards.

The first object is achieved in that measuring means are present for measuring an actual value of the first impedance, and that a memory comprising a first memory element is present such that the actual value or a derivative thereof can be stored as a first reference value in the first memory element. There are thus two locations in the semiconductor device of the invention where one and the same value is available: actual in the security element and stored in the memory element. If the actual value is not substantially equal to the stored first reference value any more, there must have been a reverse engineering attack or some other attack with the same object. The authenticity of the semiconductor device will not be recognized then.

Further measures may be implemented to ensure that, if the actual value is substantially equal to the first reference value, there has not been any reverse engineering attack. Such a measure comprises means for measuring, storing and reading a second actual value of the first security element at a second frequency; another measure is the provision of a second security element and a second memory element which have different reference values.

It is being understood in the context of this application that the measurement of the actual value or the reference value does include the determination of any parameter indicative thereof, or representing it or corresponding to it. As even the dielectric constant can be measured at difference frequencies with different results, it will be clear that this actual value need not to be a value that can be obtained independently anywhere else. However, it is a value actually measured; and if the measurement is repeated by the chip under the same conditions, it must provide the same results.

Instead thereof that this actual value is stored, the actual value as measured may be modified with algorithm means to an actual value to be stored. The algorithm means is, for instance, constituted by a microprocessor. Alternatively, it may be a circuit wherein the data format of the actual value is adapted.

It is preferred that the device is provided with a second security element that comprises a local area of the passivation structure and has a second impedance different from the first impedance; and that an actual value of the second impedance can be measured by the measuring means and stored in a second memory element of the memory as a second reference value. The provision of more than one security element enhances the complexity of the passivation structure strongly. The two security elements may be of the same kind—for example a capacitor, a resistor, an inductor, an LC-circuit, a transformer,—but alternatively of a different kind. They may further be hidden in a layer comprising a large number of other structures, such as interconnect lines. Also, the memory elements may be hidden within an array of memory elements in which other data are stored. The first and second impedances may further be measured at different frequencies. The number of security elements may be greater than two. Preferably, the number is such that the complete surface of the passivation structure is covered with security elements. For practical reasons, these may be provided as an array of security elements.

In order to realize that the first and the second security element have different impedances, the structure of the security elements may be different or the measuring conditions may be different. In an advantageous embodiment, the passivation structure has an effective dielectric constant that varies laterally over the circuit. The difference in impedance is thus related to a physically implemented variation. The term 'effective dielectric constant' is used in the sense that it is a property of one layer or a stack of layers, each of which may be a mixture of materials, and that it includes any conductivity and magnetic permeability value.

The effective dielectric constant of the passivation structure may be implemented in various ways. A first example is that the thickness of the passivation structure varies over the circuit. A second example is that the passivation structure comprises at least two layers, that have a substantially rough interface. Also, the layers may be partially mixed, or be locally modified. Furthermore, the passivation structure may consist of a multilayer stack.

In an advantageous embodiment, the passivation structure comprises a passivating layer and a security layer, which security layer comprises particles that are distributed inhomogeneously over the circuit. The security elements in this embodiment may have impedances which are dependent on the actual deposition process. The inhomogenous distribution of particles may be realized in several ways: the security layer may contain particles of different size, of different composition, of different shape, of different orientation, and in concentrations that vary over the circuit. Preferably, the particles have a size of the order of the local surface area of the security elements. A consequence thereof is, that the impedances of the individual security elements cannot be predicted. They will not be known before an initialization. This has the advantage that the memory elements will contain reference values that are practically unique and can be used for identification purposes. Another consequence of the deposition process dependent impedances is that it is practically impossible to provide the same security layer once it has been removed.

The security layer is preferably chosen such that it is practically impossible to remove and to look through it with any microscope. In an advantageous embodiment, it comprises a ceramic material and may be applied in a sol-gel process. An example of a security layer is based on monoaluminum phosphate, which is known from WO-A 99/65074. Other examples of such matrix materials include $TiO_2$, $SiO_2$ (to be applied from tetraethoxyorthosilicate), and spin-on polymers. Such a security layer may be applied on a passivating layer, in order to assure that the active elements of the underlying circuit will not be contaminated. If the size of the particles is comparable to that of the local surface area of a security element, there will be an inhomogeneous distribution automatically. Alternatively, the distribution may, for example, be made inhomogeneous by application of an inhomogeneous suspension of the matrix material filled with particles.

The first and the second electrode of the first security element may have various shapes. If the first security element is—primarily—an inductor having one turn, the first and second electrode may be connected via the one turn; i.e. they are part of the same metal line. If the first and second electrode are not part of the same metal line, they may be present at the same side or at both sides of the passivation structure. It may even be that one of the electrodes is present inside the passivation structure, and other variants will be clear to the skilled person. If there are more than one security elements, and the second electrodes are connected to a ground plane, several second electrodes may be integrated into one. The second electrodes are may be implemented as an substantially unpatterned layer that is connected to a ground plane at one point, especially if these second electrodes may be present on top of the passivation structure. Instead of a metal layer, some other electrically conductive layer may be used, such as a layer of an electrically conductive polymer or a layer comprising an electrically conductive particles. Such an unpatterned conductive layer may also be used as an ESD-protection.

In a preferred embodiment, the passivation structure is present on top of a metal layer, which metal layer comprises the first and the second electrode as well as interconnects for connection of active elements in accordance with to a desired design. It is an advantage of this embodiment that no additional metal layers need be deposited in order to provide the first and second electrodes of the security elements. Another advantage is that the electrode may be hidden in the structure of interconnects in that they are given substantially the same shape. It is preferred that the first and the second electrode of the first security element constitute a pair of interdigitated electrodes. In this embodiment, the surface area of the electrodes is relatively large, which is positive for the magnitude of the impedance.

The embodiment is especially suitable for the measurement of the capacitive part of the impedance between the first and the second electrode. Large variations in capacitance may be realized through the choice of particles with a dielectric constant different from that of the main material(s) in the passivation structure. Thus, they may have a dielectric constant that is comparatively high, such as $BaTiO_3$, $SrTiO_3$, TiN, $WO_3$, or rather low, such as air (for example a pore), an organic dielectric material, or a porous alkyl-substituted $SiO_2$.

The implementation of the measuring means will depend on the specific type of impedance to be measured. If the capacitive part of the impedance is measured, measuring means as known from the field of fingerprint sensors may be used. Such measuring means are, for example, the total of drive means and sensing means as known from U.S. Pat. No. 5,325,442. Alternatively, especially if the number of security elements is relatively small, these may be measured one after the other with a conventional circuit wherein the measurement apparatus is placed in parallel to the impedance.

In a preferred implementation, the measuring means comprise an oscillator and a binary counter. With the oscillator, the imaginary part of the impedance of a chosen security element can be measured, which results in a signal with a frequency that depends on said part of the impedance. The binary counter will compare this frequency with a standard frequency. The advantage of this implementation is its use of standard components, such as oscillators and binary counters. These are present in the integrated circuit already, and can be applied as measuring means. Alternatively and preferably, additional oscillators and binary counters may be added. Generally, the measurement will take place with an alternating current; however, the use of a direct current is not impossible.

In order to increase the specificity of the measurement of the measuring means, a second oscillator and a processor function may be added. The second oscillator will provide an oscillation at a different frequency. In fact, a reapplied passivation structure must have the same behavior as the original passivation structure, not only at one frequency, but also at the second frequency. The presence of additional means for measuring at a second frequency has the further has the advantage of an increased design freedom. For example, semiconductor devices processed on one wafer may be provided with oscillators having different frequencies.

In another embodiment, the impedance may be measured by feeding into the security element a square wave of known frequency and amplitude, that has been generated within the semiconductor device. The current is measured as result of this. The actual value calculated thereof is then digitized by means of an A/D-converter inside the semiconductor device.

The memory may be of a conventional type and include memory elements as well as a microprocessor to enable the storing and reading of data. The memory elements are preferably one-time programmable, such as EPROMs. However, they could be alternative conventional memory elements such as EEPROM, DRAM, SRAM and MRAM.

It is a second object of the invention to provide a card with a semiconductor device that will not work after removal and renewed deposition of the passivation structure of the semiconductor device. This second object is achieved in that the semiconductor device of the invention is present. Before any operation with the card, the authenticity of the semiconductor device will be checked, which will be further explained in detail in the discussion of the method of checking the authenticity according to the invention. As the actual value of the first security element can be compared with the first reference value stored in the first memory element, it is in effect impossible to replace the original passivation structure with another passivation structure that provides all security elements present with the same impedance. Therefore, a card comprising the semiconductor device of the invention can be detected to be not authentic anymore after removal and renewed deposition of the passivation structure.

The card of the invention is preferably a smartcard containing any financial or private data or giving access to any building or information. The safety requirements for such smartcards show a steady increase, which is related to the increasing confidence in and use of these smartcards. Alternatively, the card may be a transponder-type of card that can be read out contactlessly. The card may be a banknote as well. In this case the semiconductor device must be very thin. Due to the improved passivation structure of the semiconductor device, the number of interconnect layers may be reduced, thus reducing the cost price of the device. Another type of a card is a SIMcard for a mobile phone. In the case of contactless read-out, the card will contain an antenna to communicate with the access device. The semiconductor device will be connected to said antenna.

As the first impedance of the semiconductor device of the invention can be unpredictable, there is a need for an initializing method.

It is therefore a third object to provide a method initializing the semiconductor device of the invention. This object is achieved in that it comprises the steps of:

measuring an actual value of the first impedance of the first security element at a first frequency; and storing the actual value as the reference value in the first memory element.

This method is not limited to a semiconductor device with a passivation structure of which the impedance is really unpredictable. In many cases, such as the case in which the passivation structure comprises a layer filled with particles, only an average value of the impedance can be calculated. The measurement of the actual value and its storage as a first reference value renders it possible to obtain a much preciser first reference value. It may further be that the semiconductor device can be re-initialized under certain circumstances. For the purpose of re-use this is preferable, but for the purpose of security it is not. Such a re-use may be advantageous, for example, in the context of the use of semiconductor devices according to the invention for giving access to a building.

In an embodiment, the actual value of the first impedance is measured at a second frequency and stored in a second memory element as second reference value. In order to realize an enhanced security, it is preferable to measure the impedance at more than one frequency. As a consequence, this value should be measured and stored during initializing as well.

It is recognized that before being stored as a first reference value, the actual value could be modified in accordance with an algorithm. For example, the actual value could be multiplied by an integer value so as to create a value that is in the range between 0 and 1000. Also, the actual value could be modified so as to create an integer, or it could be digitized.

A method of checking the authenticity of a semiconductor device is known from WO-A 99/12121. The known method comprises a data exchange between the semiconductor device and an external device, such as a card reader. A digital random value is generated by the external device and transferred to the semiconductor device. After modification the random value is sent back to the external device. The authenticity of the device will only be recognized if the modified value corresponds to a check value deduced from the random value.

It is a disadvantage that there is a need to implement a specific modification procedure in both the semiconductor device and the external device. The presence of the modification procedure in the external device could allow any unauthorized person to find out what the modification procedure is.

It is therefore a fourth object of the invention to provide a method in which no modification procedure is necessary. This object is achieved in that the method of checking the authenticity of a semiconductor device, which has been initialized, comprises the steps of:

measuring the actual value of the first impedance at a first frequency, reading the first reference value, comparing the first reference value and the actual value, and recognizing the authenticity of the semiconductor device exclusively, if at least the difference between the actual value and the first reference value is smaller than a predefined threshold value.

The method is based on the recognition that both the actual value and the first reference value are physically fixed in the semiconductor device of the invention. As they are both present in the same device, there is no need for all semiconductor devices to fulfill the same conditions, for example that in all of them one and the same modification procedure or the means thereof are implemented. The predefined threshold value is generally very small, and is to be defined so as to allow for uncertainties of measurement or influences of temperature and other external conditions. It is a further advantage that the magnitude of the data to be exchanged is reduced, thus allowing a faster checking procedure.

It is noted here that under normal conditions there will be a plurality of security elements with impedances. It may thus be expected that all impedances, or at least some of them, must be compared with the corresponding reference values before the authenticity of the semiconductor device can be recognized completely.

It is recognized that, before being compared with the first reference value, the actual value may be modified in accordance with an algorithm. For example, the actual value may be multiplied by an integer value so as to create a value that is in the range between 0 and 1000. Also, the actual value may modified so as to create an integer, or it could be digitized. If there is a modifying algorithm, it will be implemented in the semiconductor device such that it cannot be adapted. In this way it is assured that the actual value and the first reference value are modified in the same way.

There are various options in order to assure that the actual value and the first reference value are not both modified, such that they are equal. The first option is that such a modification or replacement of both the actual value and the first reference value is made to be very difficult. This may be realized, for example, by integrating the measuring means and the memory elements into the other components of the semiconductor device. A second option is that the actual value of the first impedance is measured at a second frequency and compared with the corresponding second reference value.

A third option is that the first during initialization reference value is stored also externally to the semiconductor device. It will be transferred from the semiconductor device to a central database device after the initialization. In this central database device it will be stored as a first character of a unique chip identifier code. In this way it represents the identity of the semiconductor device. During checking of the authenticity, the first reference value is transferred to an access device. This access device may be or comprise the central database device. Alternatively, the access device may be a card reader that has access to the central database device. This first reference value is then compared with the first character of the unique chip identifier code; and the authenticity of the semiconductor device is recognized exclusively, if the first reference value corresponds to the first character of the unique chip identifier code.

In the embodiment in which the first reference value is unknown until initialization of the semiconductor device, said first reference value or a series of reference values may be used as a serial number for the identification of the semiconductor device. Such a serial number is also known as a unique chip identifier code. It may be used, for example, in a situation in which a person can get access to information or to a building with a card that is provided with a semiconductor device. Another situation is that of cards used for financial transactions of a specific bank, wherein contact is made with a computer of the bank before a transaction is carried out. These situations relate to systems comprising a reader and a limited number of cards, each of which cards is known and can be identified. As the first reference value preferably depends on an uncontrollable variation of the passivation structure, the number of possible reference values is very large. Besides, there is no pattern within the series numbers that could be detected. As the constitution and composition of the passivation structure is open to various designs, the variation in possible reference values is virtually unlimited It is a further object of the invention to provide a method of identifying a semiconductor device. This object is achieved in that the semiconductor device according to claim 1 is identified, which device has been initialized so as to store a first reference value in the first memory element, and in that the method of identifying comprises the steps of:

reading the first reference value;

transferring the first reference value from the semiconductor device to an access device which comprises or has access to a central database device in which a first character of a unique chip identifier code is stored, which first character represents the identity of the semiconductor device and corresponds to the first reference value upon at initialization of the semiconductor device;

comparing the first reference value with the first character of the unique chip identifier code; and recognizing the identity of the semiconductor device exclusively, if the first reference value corresponds to the first character of the unique chip identifier code.

These and other aspects of the semiconductor device, the card, the method of initializing, and the method of checking the authenticity of the invention will be further explained with reference to the Figures, of which.

The Figures are schematically drawn and not true to scale, and identical reference numerals in different Figures refer to corresponding elements. It will be clear those skilled in the art that alternative but equivalent embodiments of the invention are possible without deviating from the true inventive concept, and that the scope of the invention will be limited by the claims only.

Figure 1:
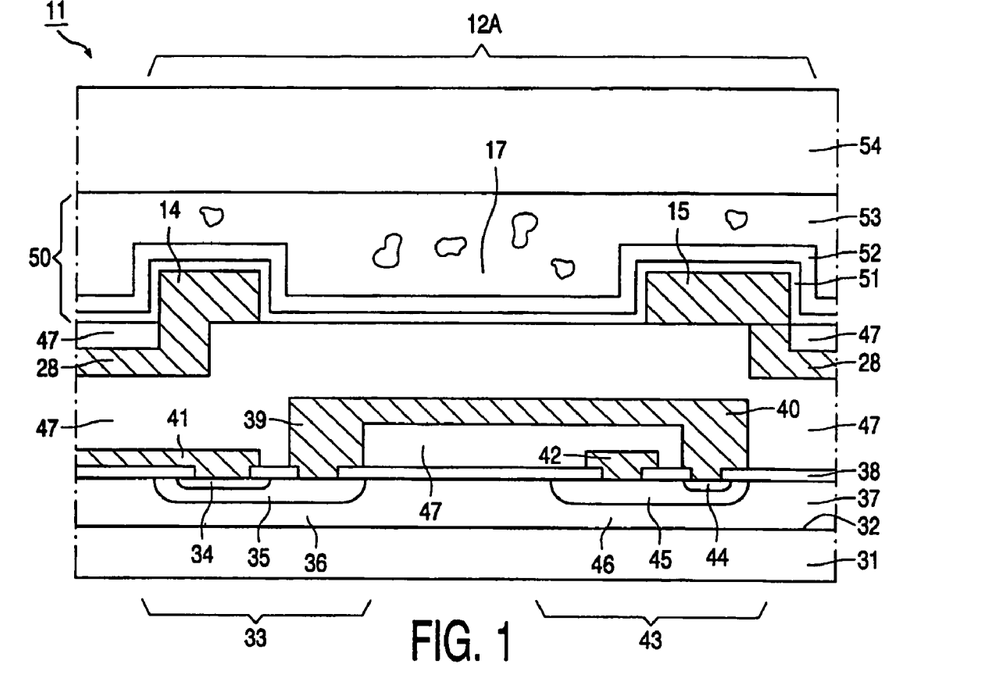
FIG. 1 is a diagrammatical cross-sectional view of a first embodiment of the semiconductor device.

In FIG. 1, the semiconductor device 11 has a substrate 31 of silicon, having a—first—side 32. On this side 32, the device 11 is provided with a first active element 33 and a second active element 43. These active elements 33, 43 are bipolar transistors in this example with emitter regions 34, 44, base regions 35, 45, and collector regions 36,46.

Said regions 34-36, 44-46 are provided in a first layer 37 which is covered with a patterned insulating layer 38 of silicon oxide. The insulating layer 38 is patterned such that it has contact windows at the emitter regions 34, 44 and the base regions 35, 45. As is known to those skilled in the art, field effect transistors may be present instead of or besides the bipolar transistor. As is further known to those skilled in the art, other elements, such as capacitors, resistors, and diodes may be integrated in the semiconductor device 11.

At these contact windows in the insulating layer 38, the said regions are connected to interconnects 39, 40, 41, 42. The interconnects in this embodiment extend at a first level and a second level. As is generally known, the interconnect structure may comprise a plurality of levels. Between the interconnects and the active elements, a barrier layer not shown is generally present. The interconnects 39, 40,41,42 are manufactured, for example, in Al or in Cu in a known manner and are covered and mutually insulated by dielectric layers 47, which preferably have a low dielectric constant. Addionally present barrier layers are not shown. Another metal layer 28 is present in between these dielectric layers 47. In this metal layer 28, the electrodes 14,15 of the first security element 12 A are defined at a mutual distance of 4 µm. The first security element further comprises a dielectric 17 that is constituted as a local area of the passivation structure 50. This passivation structure 50 in this embodiment comprises an adhesion layer 51 of phosphorus silicate glass in a thickness of 0.50 µm, a passivating layer 52 of SiN in a thickness of 0.60 µm, and a security layer 53 of monoaluminum phosphate in a thickness of 3.0 µm. This layer was applied by spincoating of a composition of 15% by weight of monoaluminum phosphate in water. The composition contained 20-50% by weight of particles and was subsequently dried at 100-150° C. Alternatively, it may be applied by spraycoating of a composition of 5-10% by weight of monoaluminum phosphate. After drying, the layer is annealed at 400-500° C. to allow condensation, due to which a transition from the liquid to the solid phase takes place. The security layer 53 has been planarized, and an epoxy material is present thereon as a package 54. The security layer 53 may be patterned so as to define contact pads for connection to a PCB, for example.

The particles contained in the security layer 53 are $TiO_2$, TiN, $SrTiO_3$ and/or modified $BaTiO_3$. Such modified $BaTiO_3$ is disclosed, for example, in U.S. Pat. No. 6,078,494. Relative dielectric constants and conductivities of these particles and the other materials in the passivation structure 50 are shown in Table 1.

TABLE 1 relative dielectric constants (relative to that of vacuum) and conductivities of several materials which may be present in the passivation structure

| type of action: | compound: | dielectric constant ($\epsilon_r$) | conductivity (µΩ cm) |
| --- | --- | --- | --- |
| Dielectric | SiN | 8 | |
| Dielectric | Phosphorous silicate glass | 4.2 | |

TABLE 1-continued relative dielectric constants (relative to that of vacuum) and conductivities of several materials which may be present in the passivation structure

| type of action: | compound: | dielectric constant ($\epsilon_r$) | conductivity ($\mu\Omega$ cm) |
|---|---|---|---|
| Dielectric | monoaluminum phosphate | 5 | — |
| Dielectric | air | ~1 | — |
| Dielectric | SiO$_2$ | 4.2 | — |
| Dielectric | mesoporous methylsubstituted SiO$_2$ | 1.9-2.3 | — |
| Conductive | TiN | — | 21.7 |
| Conductive | C (graphite) | — | 65 |
| Dielectric | TiO$_2$ | ~100 | — |
| dielectric (ferroelectric) | SrTiO$_3$ | ~300-400 | — |
| Dielectric | modified BaTiO$_3$ | ~25.000 | — |

Figure 2:
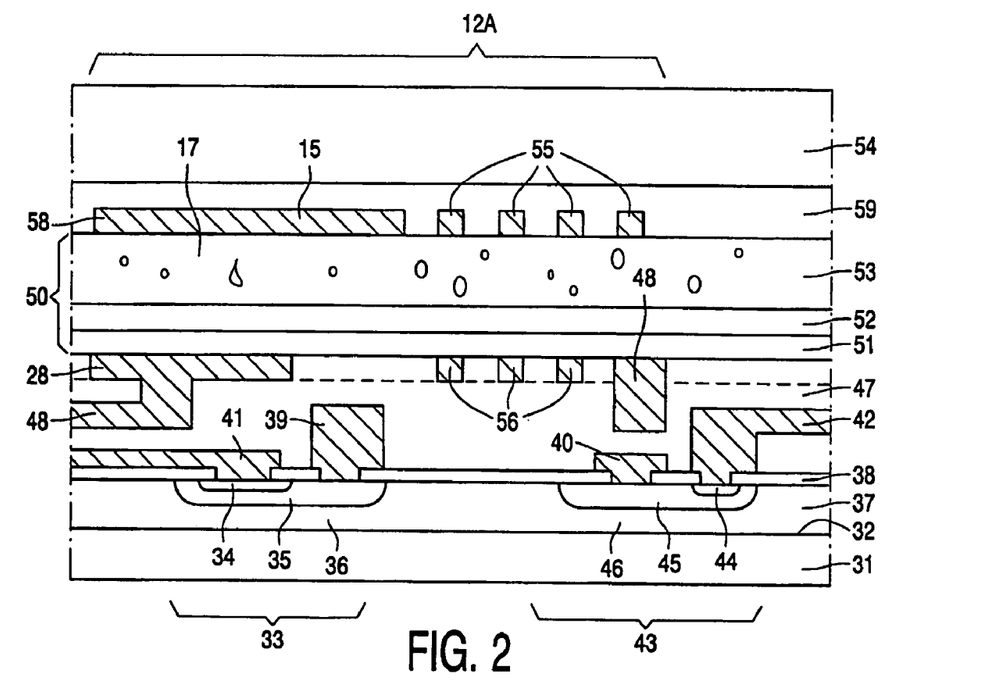
FIG. 2 is a diagrammatical cross-sectional view of a second embodiment of the semiconductor device.

FIG. 2 shows a second embodiment of the semiconductor device 11 of the invention. In the device 11 of this embodiment the first security element 12A is an LC-structure which comprises a capacitor with a first electrode 14, a second electrode 15, and a dielectric 17, and a coil with two windings 55, 56. Contrary to the embodiment of FIG. 1, the first and the second electrode 14,15 are not present in the same layer on the same side of the passivation structure 50. The first electrode 14 and the second winding 56 are present in a metal layer 28 between the passivation structure 50 and the active elements 33, 43. Each is connected to further circuitry through interconnects 48. The second electrode 15 and the first winding 55, which are mutually connected, are present in an additional metal layer 58 between the passivation structure 50 and the package 54. The additional metal layer 58 is protected against the package 54 by an additional passivating layer 59.

Figure 3:
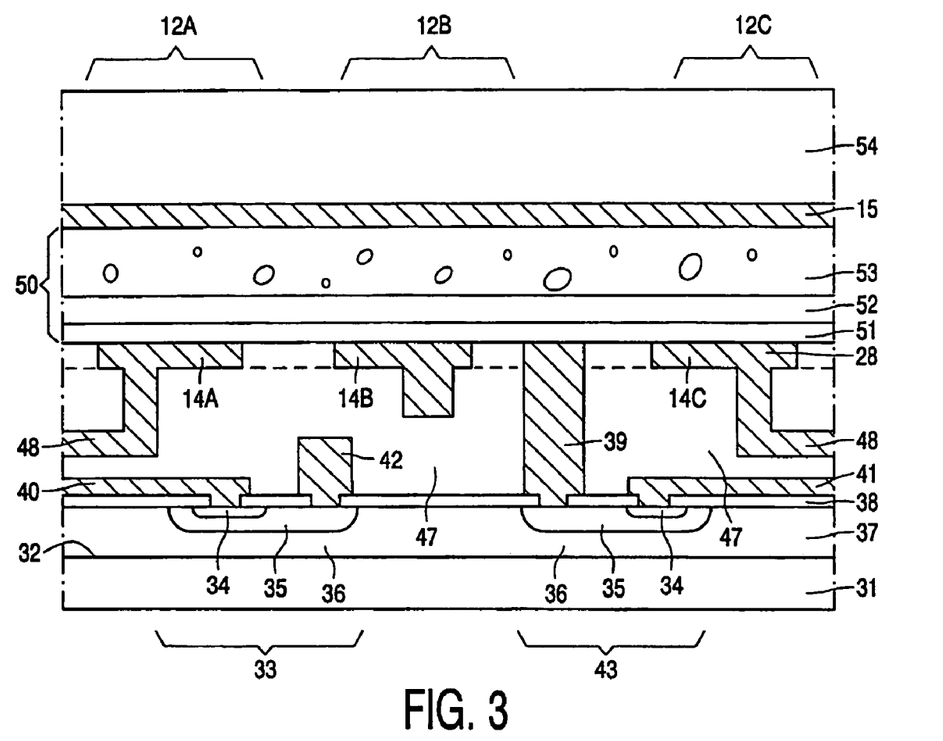
FIG. 3 is a diagrammatical cross-sectional view of a third embodiment of the semiconductor device.

FIG. 3 shows a third embodiment of the semiconductor device 11 of the invention. The device 11 of this embodiment comprises a first security element 12A, a second security element 12B, and a third security element 12C. All these security elements 12A, 12B, 12C are capacitors with a common second electrode 15 that is connected to a ground plane. The security elements 12A, 12B, 12C have different first electrodes 14A, 14B, 14C. These may be very well integrated in an array, as will be further explained with reference to FIG. 5.

Figure 4:
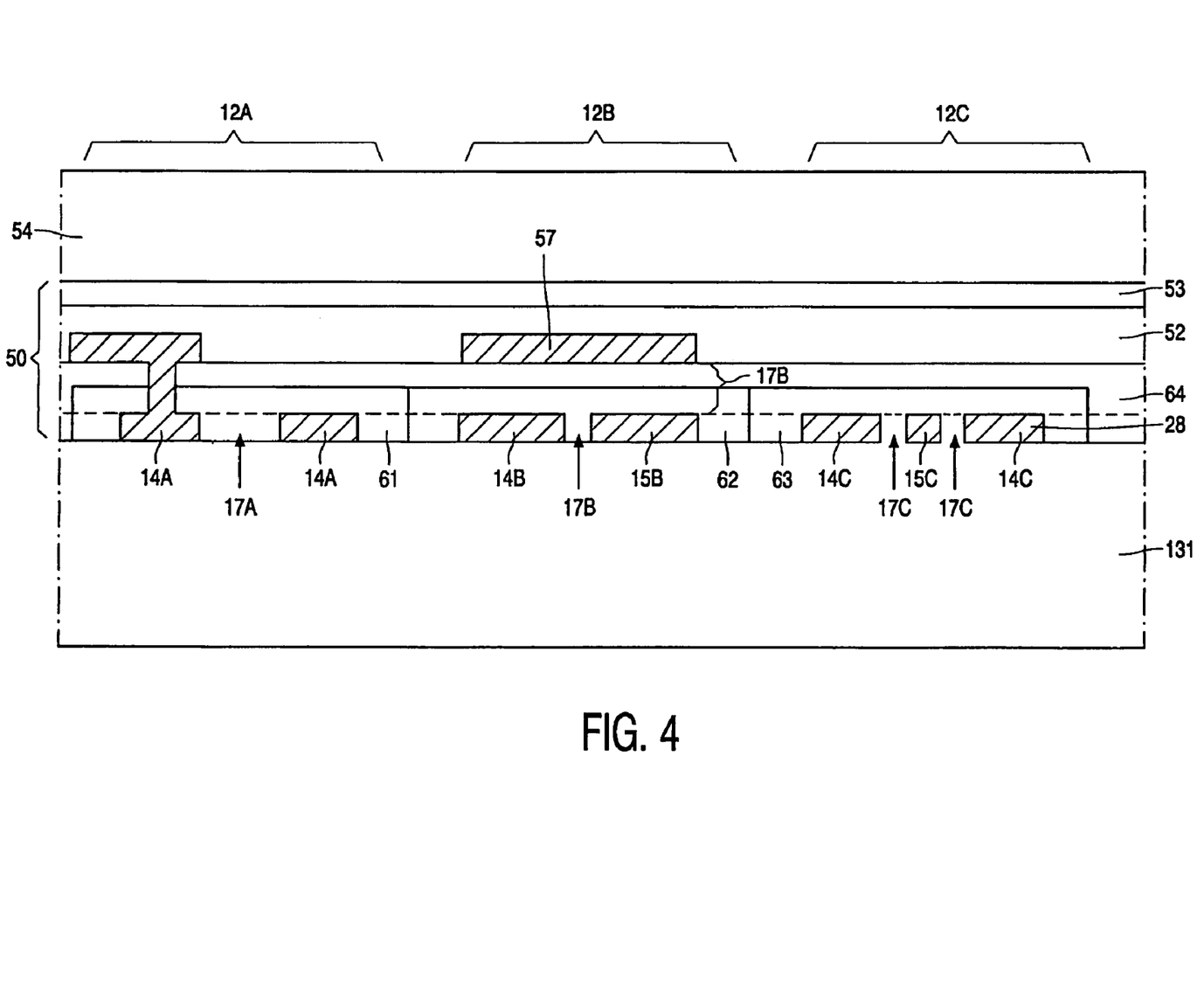
FIG. 4 is a diagrammatical cross-sectional view of a fourth embodiment of the semiconductor device.

FIG. 4 shows a fourth embodiment of the semiconductor device 11 of the invention. The drawing shows the totality of the layers 31,37 to 42, 47, and 48 as a substrate 131. The device 11 of this embodiment comprises a first, second, and third security element 12A, 12B, 12C. The passivation structure 50 of this embodiment comprises patterned layers 61, 62, 63 of various materials, an intermetal dielectric layer 64 of SiO$_2$, a passivating layer 52 of SiN, and a security layer of TiN.

The first security element 12A is a capacitor and has a first and second electrode 14A, 15A, which electrodes are present in the metal layer 28 on the same side of the passivation structure 50. The dielectric 17A is a portion of the patterned layer 61 made of methyl-substituted mesoporous SiO$_2$ obtained from a mixture of tetraethoxyorthosilicate (TEOS) and methyltrimethoxysilane (MTMS) in a molar ratio of 1:1 with a non-polar surfactant. It has a relative dielectric constant of 2.0. The distance between the electrodes 14A and 15A is 2.0 µm, the length of the electrodes is 10 µm, and the height of the electrodes is 0.7 µm. The first security element 12A thus has a capacitance of $6.3 \cdot 10^{-5}$ pF, as calculated without taking into account any stray capacitance.

The second security element 12B is a capacitor and has a first and a second capacitor electrode 14B, 15B as well as an intermediate capacitor electrode 57. The dielectric 17B comprises a portion of the intermetal dielectric layer 64 of SiO$_2$ and the patterned layer 62 of SiN. The mutual distance between the first and second electrodes 14B, 15B, which are present in the same metal layer 28, is 0.5 µm, the length of the electrodes is 40 µm, and the height of the electrodes is 0.7 µm. The width of the electrodes is 20 µm, and the distance between the electrodes 14B, 15B and the intermediate electrode 57 is 0.1 µm (0.04 µm SiN and 0.06 µm SiO$_2$). The second security element 12B thus has a capacitance of $2.40 \cdot 10^{-2}$ pF, as calculated without taking into account any stray capacitance.

The third security element 12C is a capacitor and has a first and second capacitor electrode 14C, 15C, which are present in the metal layer 28. The dielectric 17C has the shape of a channel and is a portion of the patterned layer 63 of SiO$_2$. The mutual distance between the first and second electrodes 14B, 15B is 0.5 µm, the length of the channel is 100 µm and the height of the electrodes is 0.7 µm. The third security element 12C thus has a capacitance of $5.4 \cdot 10^{-3}$ pF, as calculated without taking into account any stray capacitance.

Figure 5:
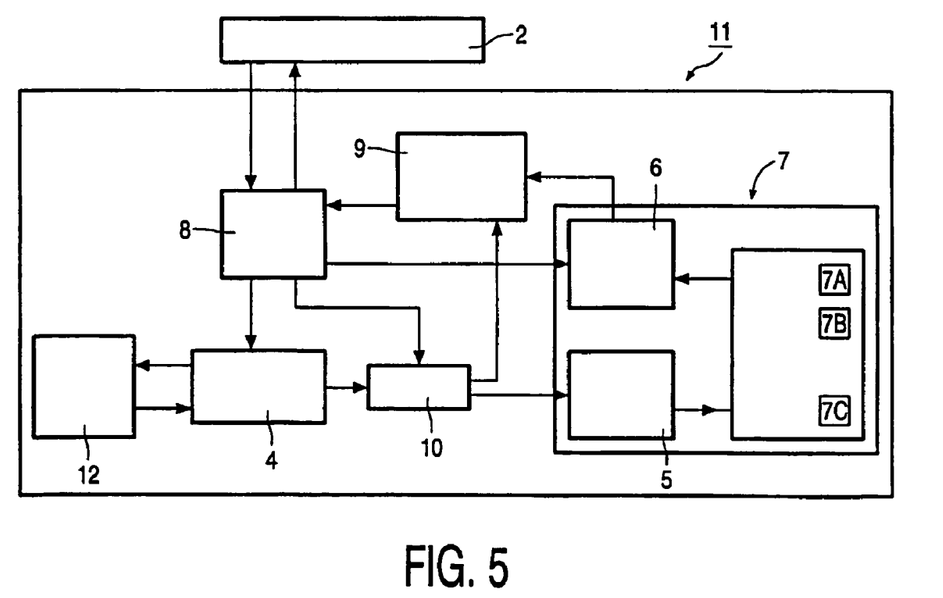
FIG. 5 is a schematic diagram of the semiconductor device.

FIG. 5 is a diagram of an embodiment of the semiconductor device 11 together with an access device 2. The semiconductor device 11 comprises various means: measuring means 4, memory 7, control means 8, and a verification control 9. Furthermore, the semiconductor device comprises a plurality of security elements 12 as well as a switch 10. The memory 7 comprises a plurality of memory elements 7A, 7B, 7C, . . . , as well as a storage control 5 and a read control 6. The control means 8 and the verification control 9 may be integrated into one function, this being a microprocessor or a dedicated circuit. The control means 8 need not be dedicated solely to the control of the measuring, storing and reading of the impedances of the security elements 12, but may control the functioning of the complete semiconductor device, including a further memory with financial or identity data. Also, the memory 7 need not be designed for the impedances of the security elements 12 only, as any person skilled in the art of integrated circuit design will understand. The security elements 12 are capacitors in this example and are connected to a ground plane at one side. The access device 2 is generally a card reader, but it may be someother device, for example an apparatus carrying out the initialization.

The circuit in the semiconductor device 11 functions as follows: during initialization, a signal is sent from the access device 2 to the semiconductor device 11, requesting the initialization. This signal enters the control means 8. The control means 8 will send a signal to the measuring means 4, indicating that the security elements 12 are to measured. It is preferred that this signal is a signal with which the first security element 12 can be selected, measured and stored; in this case a microprocessor need not be included in the measuring means 4. In this preferred embodiment, the number of signals from the control means to the measuring means 4 will be equal to or greater than the number of security elements 12. After being measured, the actual value of the first impedance is sent via a switch 10 to the memory 7. The storage control 5 causes the actual value to be stored in the first memory element 7A. Preferably, a signal is sent from the storage control 5 to the control means 8 to indicate the succesful completion of the storing of the first reference value.

The switch 10 will provide access to the storage control 5 as long as the initialization has not been completed. After completion of the initialization, the control means 8 will provide a signal to the switch 10. This signal causes the switch 10 to change its state and to provide signals to the verification control subsequently. The switch 10 may be implemented in several ways: it may be a transistor or a pindiode. Alternatively, it may be a combination of an antifuse and a fuse, wherein the fuse is present at the exit to connection the storage control 5, and the antifuse is present at the exit to the verification control 9. The signal of the control means 10 will be or will provide a voltage peak, allowing the output connection the storage control 5 to be broken and the output connection the verification control 9 to be closed. In this embodiment, the switch can be switched only once, such as known per se from U.S. Pat. No. 5,032,708. Such a voltage peak may be provided because during initialization a contact can be made between the access device 2 and the semiconductor 11, even if normal communication between the semiconductor device 11 and an access device 2 is contactless. Further embodiments will be clear to those skilled in the art. It is not excluded, as will be apparent to the skilled person, that the switch 10 and the storage control 5 are integrated into one functional unit.

In checking the authenticity or the identity of the semiconductor device 11, the circuit operates as follows: during initialization, a signal is sent from the access device 2 to the semiconductor device 11, requesting the check. This signal enters the control means 8. The control means 8 will send a signal to the measuring means 4, indicating that the security elements 12 are to be measured. This will be done in the same way as during initialization. The actual value of the first impedance will be sent to the verification control 9 via the switch 10. This verification control 9 will have or will receive the first reference value of the first impedance as well. This first reference value will have been read from the first memory element 12A by the read control 6, after having obtained a signal from the control means 8, or optionally from the verification control 9. Then the actual value and the first reference value can be compared. If the difference between the two values is smaller than a predefined threshold value, for instance 3%, then a positive signal—stating okay—will be sent to the control means 8. This may be done immediately, or after a comparison of all the actual values with all reference values, or after a comparison of a selected number of the actual values with the corresponding reference values. Preferably, the reference value is sent to the control means 8 as well in the case of a positive signal. The actual communication may be subject to a variety of algorithms, as those skilled in the art will understand. The predefined threshold value will depend on the precision of the measuring means. It could be alternatively 10 or 20%, especially if the number of security elements is large, for example lo or more. Alternatively again, it could be less than 1%, which is partially dependent on the customer's wishes and the state of the art of integrated circuit design.

Figure 6:
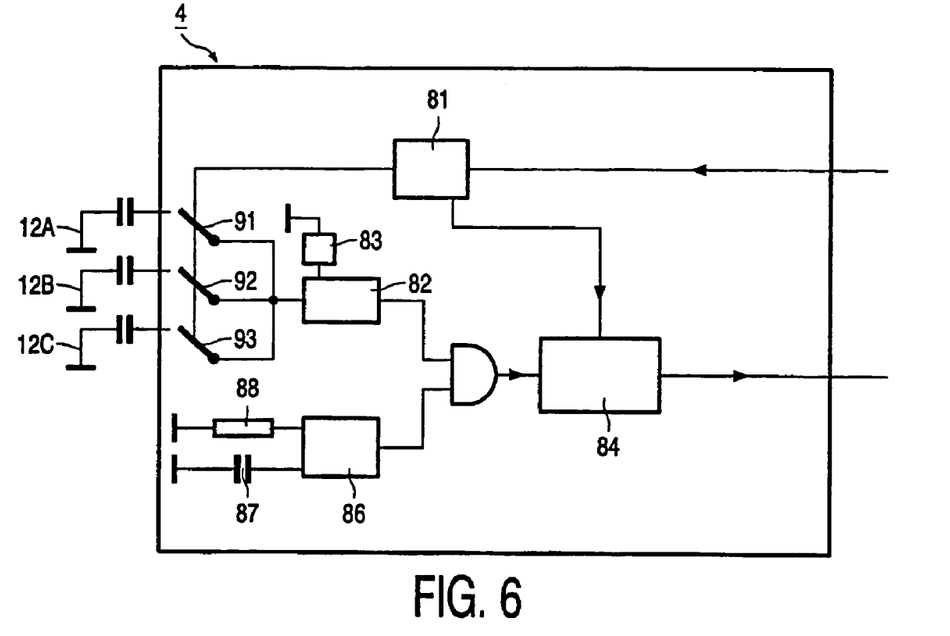
FIG. 6 shows an embodiment of the measuring means of the semiconductor device.

FIG. 6 shows a first embodiment of the measuring means 4 of the semiconductor device 11. The security elements 12A, 12B and 12C are shown as well. The measuring means 4 of this embodiment measure the imaginary part of the impedance of the security elements 12. In fact, the oscillator 82 provides a signal to the counter 84, whose frequency depends on said imaginary part of the impedance of the measured security element 12. The counter 84 compares this frequency with a signal having a clock frequency. This signal originates from an oscillator with a capacitor 87 and a resistor 88 which both have a precise and well-known value. The result of the comparison in the—binary—counter 84 is a digitized signal which can be stored. The digitized signal is the actual value of the impedance of the measured security element 12. The actual value may be present in any kind of SI-units, or alternatively in any semiconductorspecific value, as it will not be compared with any externally measured value. A selection unit 81 is present for selecting which security element 12A, 12B, 12C is to be measured. It will send signals such that one of the switches 91, 92, 93 is on, and one of the security elements 12A, 12B, 12C is measured. The switches are preferably transistors. Alternatively, a desired combination of security elements 12 may be measured so as to minimize the number of measuring steps and not to complicate the security. Said multiple simultaneous measuring is understood as measuring the actual value of the first security element 12A in the context of this application. The selection unit also provides a signal to the counter 84 after a measuring step, so as to clear its result.

The selection unit 81 may be part of the control means 8. Furthermore, the oscillator 86 may be embodied as the clock generator of the semiconductor device 11. In that case it can be absent in the measuring means 4, and its signal may be sent to the counter 84 via the control means 8. In order to obtain actual and reference values that are precise enough, such that the difference between them is lower than a threshold value of 3-5%, the oscillators 82, 86 are adjusted so as to be correct to within about 1%. This is done in a usual way known to the skilled person, and preferably by the provision of an adequate design.

It is preferred that the security element 12C is a reference element, whose actual value is known. It may be realized, for example, by implementing this element 12C in the interconnect structure; especially so if the passivation structure 50 comprises a security layer 53 with particles that are distributed inhomogeneously. This reference security element 12C may be used for optimizing the measuring results, and an possible deduction of actual values from the results of the binary counter 84.

Figure 7:
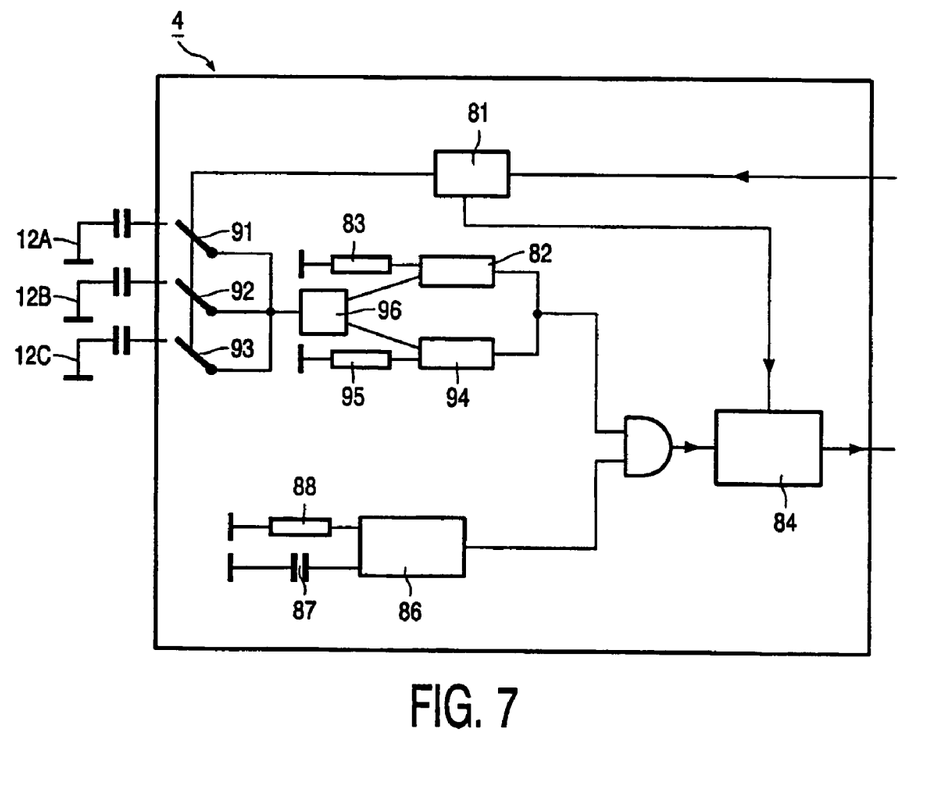
FIG. 7 shows another embodiment of the measuring means of the semiconductor device.

FIG. 7 shows a second embodiment of the measuring means 4 of the semiconductor device 11, which is largely identical to the first embodiment. In this case a second oscillator 94 with resistor 95 is provided, as well as a switch 96. The selection unit 81 here selects not only the security element 12A, 12B, 12C that is to be measured, but also the oscillator 82, 94 with which the security element 12A, 12B, 12C is to be measured. As the oscillators 82, 94 are scaled differently, their frequencies will differ. Hence, the embodiment can measure the impedance at two frequencies. Preferably, the resulting actual values are both stored. These values may then be mutually compared in a comparator that is placed functionally behind the binary counter 84.

Figure 8:
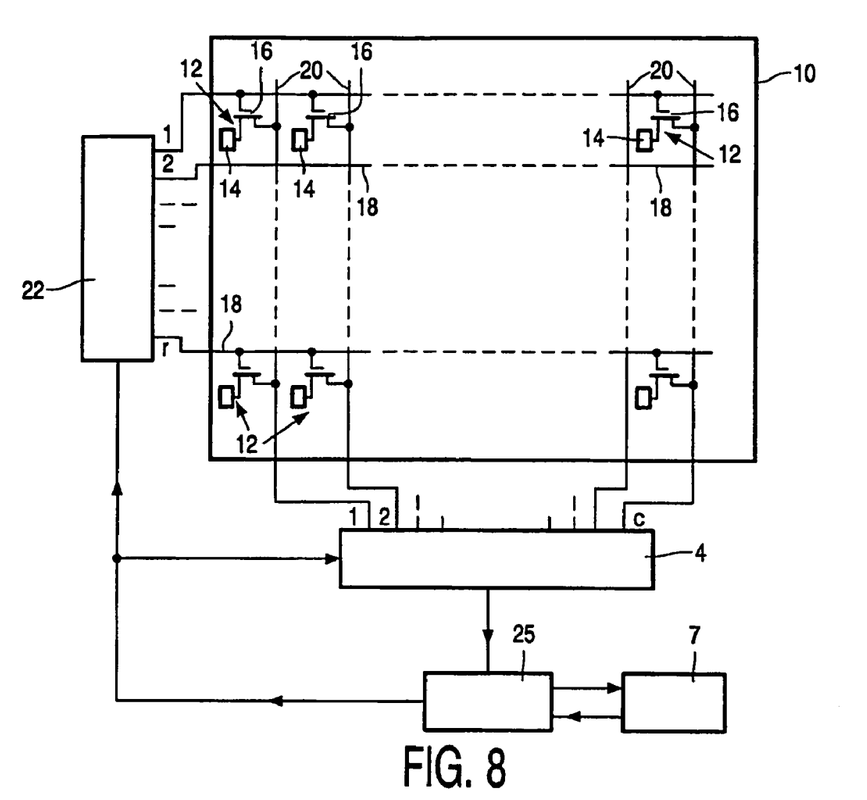
FIG. 8 is a simplified schematic diagram of an embodiment of the semiconductor device showing an array of the security elements together with associated addressing circuitry.

FIG. 8 is a simplified schematic diagram of an embodiment of the semiconductor device 11, showing an array of the security elements together with measuring means 4 and a memory 7. The semiconductor device 11 comprises an active matrixaddressed sensing pad 10 having a X-Y array of security elements 12 consisting of r rows (1 to r) with c security elements 12 in each row. Only a few rows and columns are shown for simplicity's sake. The security elements 12 of this embodiment are capacitors with a first electrode 14 and a second electrode (not shown). These second electrodes are connected to a ground plane (also not shown). The first electrode 14 is connected to an active device, which in this embodiment comprises a threeterminal switching device 16 in the form of a field effect transistor (FET). The X-Y array of security elements 12 is addressed via sets of row (selection) and column (sensing) address conductors 18 and 20, respectively. The gate and source of the FET 16 of a security element 12 are connected to a row conductor 18 and a column conductor 20, respectively. The FET's drain electrode is connected to the first electrode 14. All security elements 12 in the same row are connected to a respective common row conductor 20. The row conductors 18 are connected at their one ends to a row driver circuit, generally referenced 22, and the column conductors 20 are connected at their one ends to measuring means, for example the sensing circuit 4.

Sensing the capacitance variations among the various security elements 12 in the array is accomplished as follows. Each security element 12 is addressed through associated row (selection) and column (sensing) conductors 18 and 20. A gating pulse applied to a row conductor 18 by the row driver circuit 22 turns on the FETs 16 of all security elements 12 in the row of elements associated with the row conductor. A supply voltage of, for example, 1.5 V. is simultaneously applied by the circuit—i.e. the measuring means—4 to all column conductors 20 so that, upon the FETs 16 being turned on, the capacitors (i.e. the security elements 12) of that row are charged to the potential of the column conductors. The charging current for the capacitors flows up the column conductors 20 and is sensed by an appropriate amplifier within the measuring means 4. The magnitude of the charge flowing into each capacitor depends on the size of the capacitor. Therefore, by measuring the charging currents in each column conductor 20 the size of each capacitor can be assessed. This procedure is repeated for each row of security elements of the array in turn sequentially.

The measuring means 4 may be of various configurations, such as a current sensing circuit configuration and a charge amplifier circuit configuration. Such circuit configurations are known, for example, from U.S. Pat. No. 5,325,442 and need no further disclosure.

The output of the measuring means 4 is formed by the actual values of the impedances of the security elements 12. This output is preferably a digital signal. Accordingly, it will be appreciated that the memory generally follows conventional practice, as will be apparent those skilled in the art, and it is considered unnecessary, therefore, to describe these components in detail. Briefly, the output is transferred to a microprocessor 25. After a possible analysis of the output, the microprocessor 25 will, in the case of an initializing run, store the output as reference values in the memory 7 comprising the plurality of memory elements that accompany the plurality of security elements 12. In the case of a run to check the authenticity, the microprocessor 25 will act as a reading control to read the reference values from the memory elements. These values will be compared. The result will be sent to an access device 2, for example a card reader, preferably accompanied by the actual value and/or the reference value.

Figure 9:
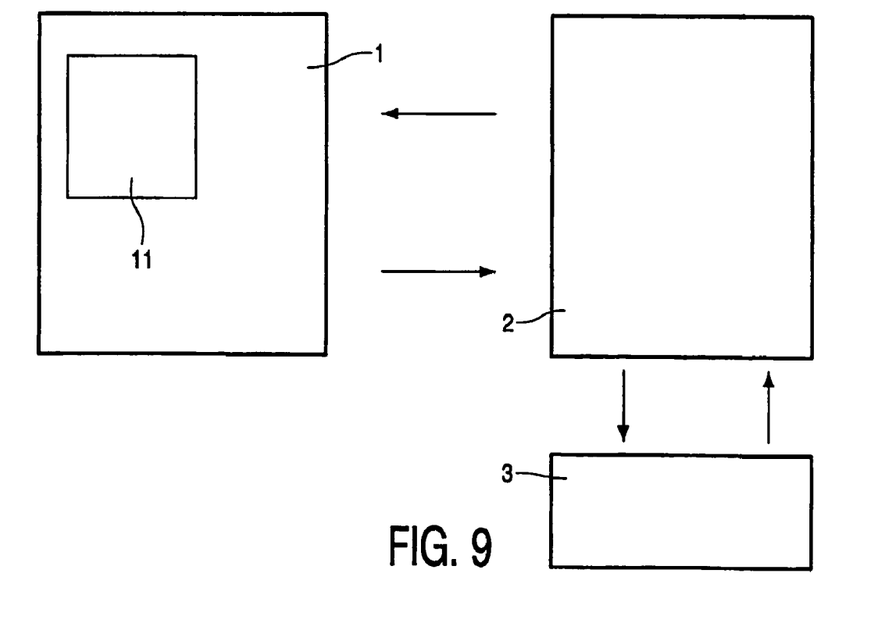
FIG. 9 schematically shows a system comprising the card and an access device and a central database device.

FIG. 9 schematically shows a system of the card 1, the access device 2, and a central database device 3. When a card 1 is detected in the access device 2, the access device 2 will inter into communication with the card 1 in this embodiment. Such a communication may be arranged in a contactless way of with contact, both versions known to the skilled person. After establishing communication, the access device will provide a signal to the card 1, and especially to the semiconductor device 11 present thereon, to obtain actual values of the impedances of the security elements 12, and to compare these with the reference values in the corresponding memory elements 7. As a result, the semiconductor device will compare these actual and reference values. It will then transfer the differences between them as well as the reference values to the access device 2. This access device 2 can recognize the authenticity of the semiconductor device if the differences are smaller than a predefined threshold value, which is, for example, approximately about 3 to 5%. As a consequence, it may give access. Alternatively, it may read the unique chip identifier code from a central database device 3. The actual values will then be compared with to the unique chip identifier code. If these are substantially equal, the authenticity of the semiconductor device 11 will be recognized. It is a matter of decision, whether the comparison with the unique chip identifier code is made for every semiconductor device 11. For example, it could be decided that this is only necessary if the semiconductor device 11 has not been recognized by the access device 2 for a certain period of time. The information as to when the semiconductor device 11 was recognized last, is stored, preferably in the access device 2, in that case. Depending on the concrete situation, the central database device 3 may be external or internal to the access device 2. Also, some information of the central database device 3 may be stored in a local memory. Furthermore, instead of the embodiment wherein the differences between the respective actual values and reference values are calculated in the semiconductor device 11, both the actual and the reference values may be transferred to the access device 2. It is also possible that not all actual values are measured, but only some of them. If it turns out that the difference between actual values and reference values in this partial measurement is substantially equal to zero, then the measurement of the impedances of the remaining security elements 12 may be abandoned under certain conditions.

The invention claimed is:

1. A semiconductor device provided with a circuit comprising an active element, which circuit is present at a side of a substrate and is covered by a passivation structure, which semiconductor device is further provided with a first security element comprising a local area of the passivation structure and a first and a second electrode and having a first impedance, the semiconductor device further comprising:
   measuring means for measuring an actual value of the first impedance at a first frequency, and
   a memory comprising a first memory element, such that the actual value can be stored as first reference value in the first memory element,
   wherein the passivation structure has an effective dielectric constant that varies laterally over the circuit.

2. A semiconductor device as claimed in claim 1, further comprising:
   a second security element that comprises a local area of the passivation structure and a first and second electrode, the second security element has a second impedance, different from the first impedance; and wherein
   an actual value of the second impedance can be measured by the measuring means and stored in a second memory element of the memory as a second reference value.

3. A semiconductor device as claimed in claim 1, wherein the passivation structure comprises a passivating layer and a security layer, which security layer comprises particles which are distributed inhomogeneously over the circuit.

4. A semiconductor device as claimed in claim 1, wherein:
   the passivation structure is present on top of a metal layer,
   the first and a second electrode of the first security element are present in the metal layer, and the metal layer further comprises interconnects for connection of active elements in accordance with to a desired design.

5. A semiconductor device as claimed in claim 1, wherein the measuring means comprises an oscillator for measurement of actual values of the first and the second impedance at a second frequency.

6. A semiconductor device as claimed in claim 1, wherein a plurality of security elements with a plurality of associated memory elements is present.

7. A card provided with a semiconductor device as claimed in claim 1.

8. A semiconductor device comprising:
a substrate;
an active circuit on said substrate;
a passivation structure covering said active circuit;
a first security element comprising a first portion of the passivation structure with a first electrode proximate to a first position on the first portion of the passivation structure and a second electrode proximate a second position on the first portion of the passivation structure, the first security element having a first impedance at a first frequency;
measuring element that measures an actual value of the first impedance at the first frequency; and
a memory, on said semiconductor device, comprising a first memory element, that stores the actual value as a first reference value in the first memory element.

9. The semiconductor device of claim 8 further comprising:
a second security element that comprises a second portion of the passivation structure and a third and fourth electrode each proximate to different locations on the second portion of the passivation structure, the second security element having a second impedance different from the first impedance,
wherein an actual value of the second impedance can be measured by the measuring element and stored in a second memory element of the memory as a second reference value.

10. The semiconductor device of claim 8, wherein the passivation structure has an effective dielectric constant that varies laterally over the circuit.

11. The semiconductor device of claim 10, wherein the passivation structure comprises a security layer that includes particles distributed inhomogeneously over the circuit.

12. The semiconductor device of claim 8, wherein the measuring element comprises an oscillator for measurement of actual values of the first and second impedance at the first and a second frequency.

13. The semiconductor device of claim 8, wherein the semiconductor device is installed in a transaction card.

* * * * *